United States Patent
Li et al.

(10) Patent No.: US 10,747,080 B2
(45) Date of Patent: Aug. 18, 2020

(54) ACTIVE DEVICE ARRAY SUBSTRATE AND DISPLAY DEVICE USING SAME

(71) Applicant: AU OPTRONICS CORP., Hsin-Chu (TW)

(72) Inventors: Chang-Hung Li, Hsin-Chu (TW); Hsien-Hung Su, Hsin-Chu (TW); Ming-Hsien Lee, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 92 days.

(21) Appl. No.: 15/895,155

(22) Filed: Feb. 13, 2018

(65) Prior Publication Data
US 2018/0231817 A1 Aug. 16, 2018

(30) Foreign Application Priority Data
Feb. 15, 2017 (TW) .............................. 106104909 A

(51) Int. Cl.
*G02F 1/136* (2006.01)
*G02F 1/1368* (2006.01)
*G02F 1/1339* (2006.01)
*G02F 1/1333* (2006.01)
*H01L 27/12* (2006.01)
(Continued)

(52) U.S. Cl.
CPC .......... *G02F 1/1368* (2013.01); *G02F 1/1337* (2013.01); *G02F 1/13394* (2013.01); *G02F 1/133345* (2013.01); *H01L 27/124* (2013.01); *H01L 27/1248* (2013.01); *H01L 27/1262* (2013.01); *G02F 1/136227* (2013.01);
(Continued)

(58) Field of Classification Search
None
See application file for complete search history.

(56) References Cited

U.S. PATENT DOCUMENTS 7,245,012 B2 7/2007 Chen et al.
7,390,734 B2 6/2008 Chen et al.
(Continued)

FOREIGN PATENT DOCUMENTS

CN 1573485 A 2/2005
CN 101114658 A 1/2008

OTHER PUBLICATIONS

Office Action issued by the State Intellectual Property Office of the Peoples Republic of China dated Apr. 18, 2019 for Application No. CN201710309217.4.
(Continued)

*Primary Examiner* — Richard H Kim
(74) *Attorney, Agent, or Firm* — Tim Tingkang Xia, Esq.

(57) ABSTRACT

An active device array substrate includes: a substrate, a switch device, an inter-layer dielectric layer, an insulation bump, a conductive layer, and a pixel electrode. The switch device is located on the substrate. The inter-layer dielectric layer is located on the switch device, and the inter-layer dielectric layer has at least one opening, where the opening does not cover at least one part of a drain electrode of the switch device. The insulation bump covers at least partially the opening. The conductive layer is located on a top surface and a side wall of the insulation bump, and is electrically connected to the drain electrode of the switch device through the opening. The pixel electrode is electrically connected to the conductive layer.

19 Claims, 16 Drawing Sheets

(51) Int. Cl.
*G02F 1/1337* (2006.01)
*G02F 1/1362* (2006.01)

(52) U.S. Cl.
CPC ............ *G02F 2001/136222* (2013.01); *G02F 2201/40* (2013.01); *G02F 2201/50* (2013.01)

(56) References Cited

U.S. PATENT DOCUMENTS

| | | |
|---|---|---|
| 7,623,212 B2 | 11/2009 | Lee |
| 7,915,614 B2 | 3/2011 | Shin et al. |
| 2004/0257510 A1 | 12/2004 | Chae |
| 2010/0171131 A1* | 7/2010 | Iki .................... H01L 29/78633 257/91 |
| 2010/0321283 A1 | 12/2010 | Mizuno et al. |
| 2011/0037072 A1 | 2/2011 | Moriwaki |
| 2014/0175399 A1 | 6/2014 | Choi et al. |
| 2015/0027719 A1 | 1/2015 | Duncan et al. |

OTHER PUBLICATIONS

Office Action issued by the State Intellectual Property Office of the Peoples Republic of China dated Sep. 16, 2019 for Application No. CN201710309217.4.

* cited by examiner

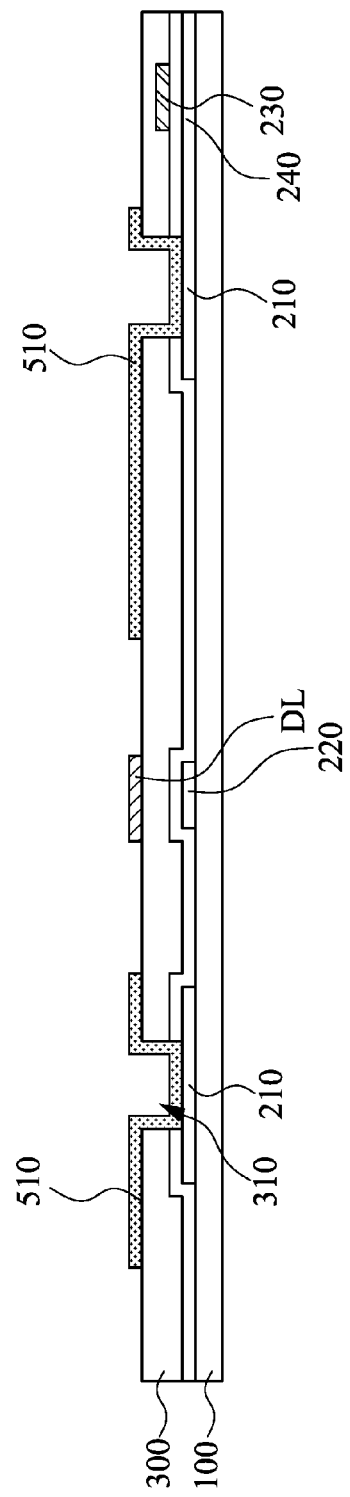

ACTIVE DEVICE ARRAY SUBSTRATE AND DISPLAY DEVICE USING SAME

CROSS-REFERENCE TO RELATED PATENT APPLICATION

This non-provisional application claims priority to and the benefit of, pursuant to 35 U.S.C. § 119(a), patent application Serial No. 106104909 filed in Taiwan on Feb. 15, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an active device array substrate and a display device using the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, with prosperous development of display technologies, display devices (for example, computers or television screens) are increasingly valued. Conventionally, a display device includes a color filter substrate, a display medium, and an active device array substrate. In addition, a spacer is also disposed between the active device array substrate and the color filter substrate, to prevent the two substrates from contacting each other. However, in a manufacturing process of the display device, the color filter substrate and the active device array substrate are easily misplaced, and consequently a visual effect of the display device is affected. In addition, the spacer and the active device array substrate are also vulnerable to an external force to generate relative displacement or deformation. Consequently, an unpredictable phenomenon occurs. For example, the spacer may cause an alignment layer to be peeled off. Consequently, a phenomenon of a shimmering bright dot or light leakage of the display device occurs.

SUMMARY

According to some embodiments of the present disclosure, an active device array substrate includes: a substrate, at least one switch device, an inter-layer dielectric layer, at least one insulation bump, at least one conductive layer, and at least one pixel electrode. The at least one switch device is located on the substrate. The inter-layer dielectric layer is located on the switch device, and the inter-layer dielectric layer has at least one opening, where the opening does not cover at least one part of a drain electrode of the switch device. The at least one insulation bump covers at least partially the opening. The at least one conductive layer is located on a top surface and a side wall of the insulation bump, and is electrically connected to the drain electrode of the switch device through the opening. The at least one pixel electrode is electrically connected to the conductive layer.

According to some embodiments of the present disclosure, a display device is provided, including the foregoing active device array substrate, an opposing substrate, a display medium layer, and at least one spacer. The display medium layer is located between the active device array substrate and the opposing substrate. The at least one spacer is located between the active device array substrate and the opposing substrate, and is located at least partially on the insulation bump.

According to some embodiments of the present disclosure, a method for manufacturing an active device array substrate is provided, including the following steps: forming at least one switch device on a substrate; forming an inter-layer dielectric layer on the switch device; forming at least one opening in the inter-layer dielectric layer, where the opening does not cover at least one part of a drain electrode of the switch device; forming at least one insulation bump and at least one conductive layer, where the insulation bump covers at least partially the opening, the conductive layer is located on a top surface and a side wall of the insulation bump, and the conductive layer is electrically connected to the drain electrode of the switch device through the opening; and forming at least one pixel electrode electrically connected to the conductive layer.

layer is electrically connected to the overlapping portion, so that the first conductive sub-layer and the second conductive sub-layer form the conductive layer together.

The foregoing is used to describe problems to be resolved in the present disclosure, technical means for resolving the problems, effects of the technical means, and the like. Specific details of the present disclosure are described in the following embodiments and related figures.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

Multiple aspects of the present disclosure may be learnt by reading the following detailed descriptions with reference to the corresponding figures. It should be noted that actual proportions of multiple features in the figures are not drawn according to standard practice in the industry. In fact, sizes of the features can be arbitrarily increased or decreased for clarity of discussion.

FIG. 8A and FIG. 8B respectively show cross-sectional views of different stages of an active device array substrate in a manufacturing procedure according to some embodiments of the present disclosure, where a cross-sectional location corresponds to a line segment 2B-2B' in FIG. 2A.

DETAILED DESCRIPTION

The spirit of the present disclosure is clearly described below by using figures and detailed descriptions. A person of ordinary skill in the related art may change and modify a technology shown in the present disclosure after learning embodiments of the present disclosure. The changes and modifications do not depart from the spirit and scope of the present disclosure.

Generally, in a technology in which a color filter layer is directly integrated on an active device array substrate, the color filter layer may be disposed on one side of a switch device. However, a drain electrode of the switch device needs to be electrically connected to a pixel electrode. Therefore, the color filter layer needs to have an opening, so that the pixel electrode can be filled in the opening to be in contact with the drain electrode. However, considering a limit of a manufacture procedure and an alignment deviation, a size of the opening of the color filter layer needs to range from 20 microns to 25 microns, or even larger, and therefore sacrifice of an aperture opening ratio is caused. Consequently, the aperture opening ratio and resolution of a display device cannot be further improved. In view of this, the present disclosure provides an active device array substrate and a display device using the same. The active device array substrate may increase an aperture opening ratio and resolution of the display device, and may reduce a phenomenon of a shimmering bright dot or light leakage of the display device.

Figure 1A:
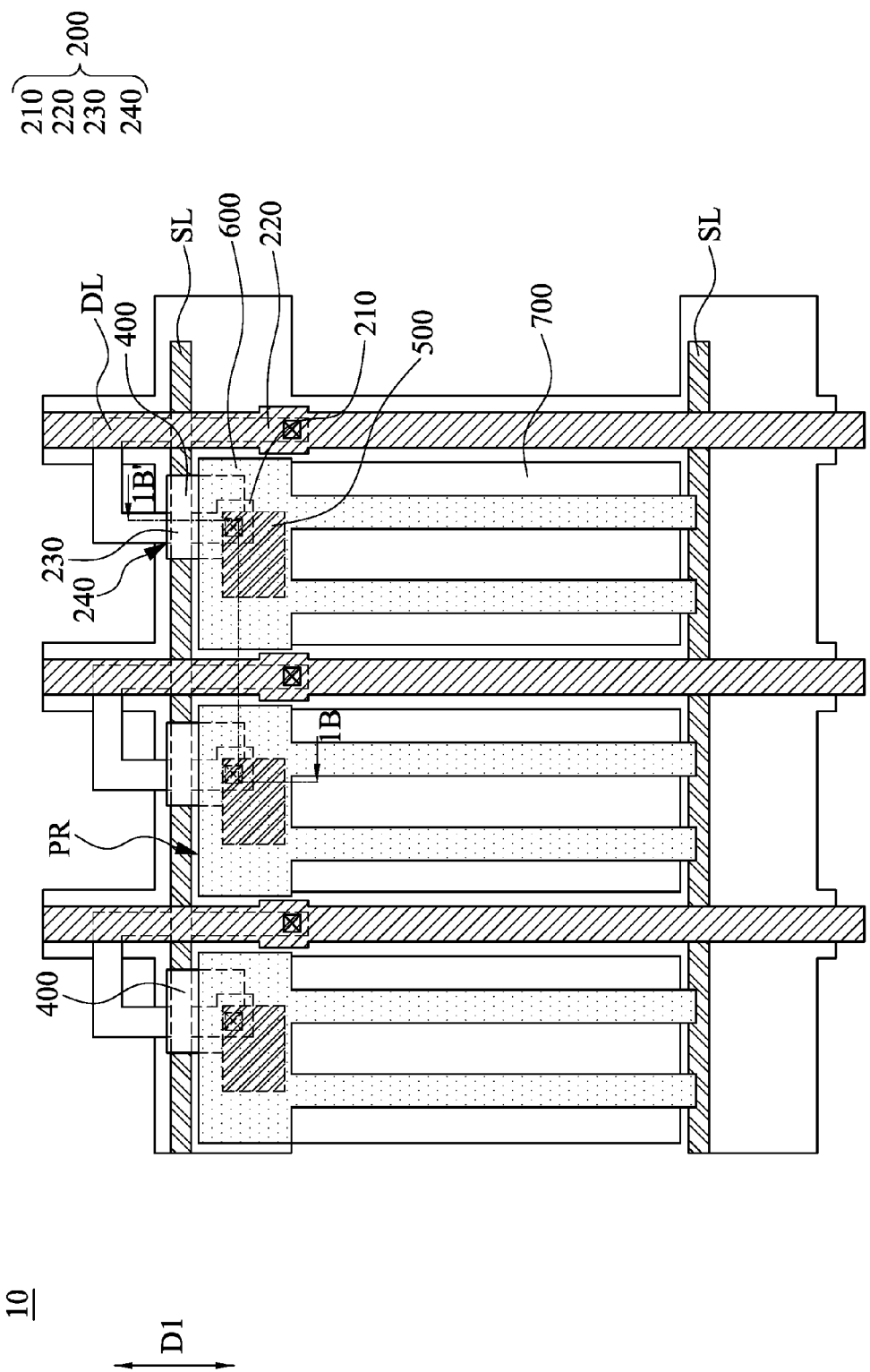
FIG. 1A is a schematic top view of an active device array substrate according to some embodiments of the present disclosure.
Figure 1B:
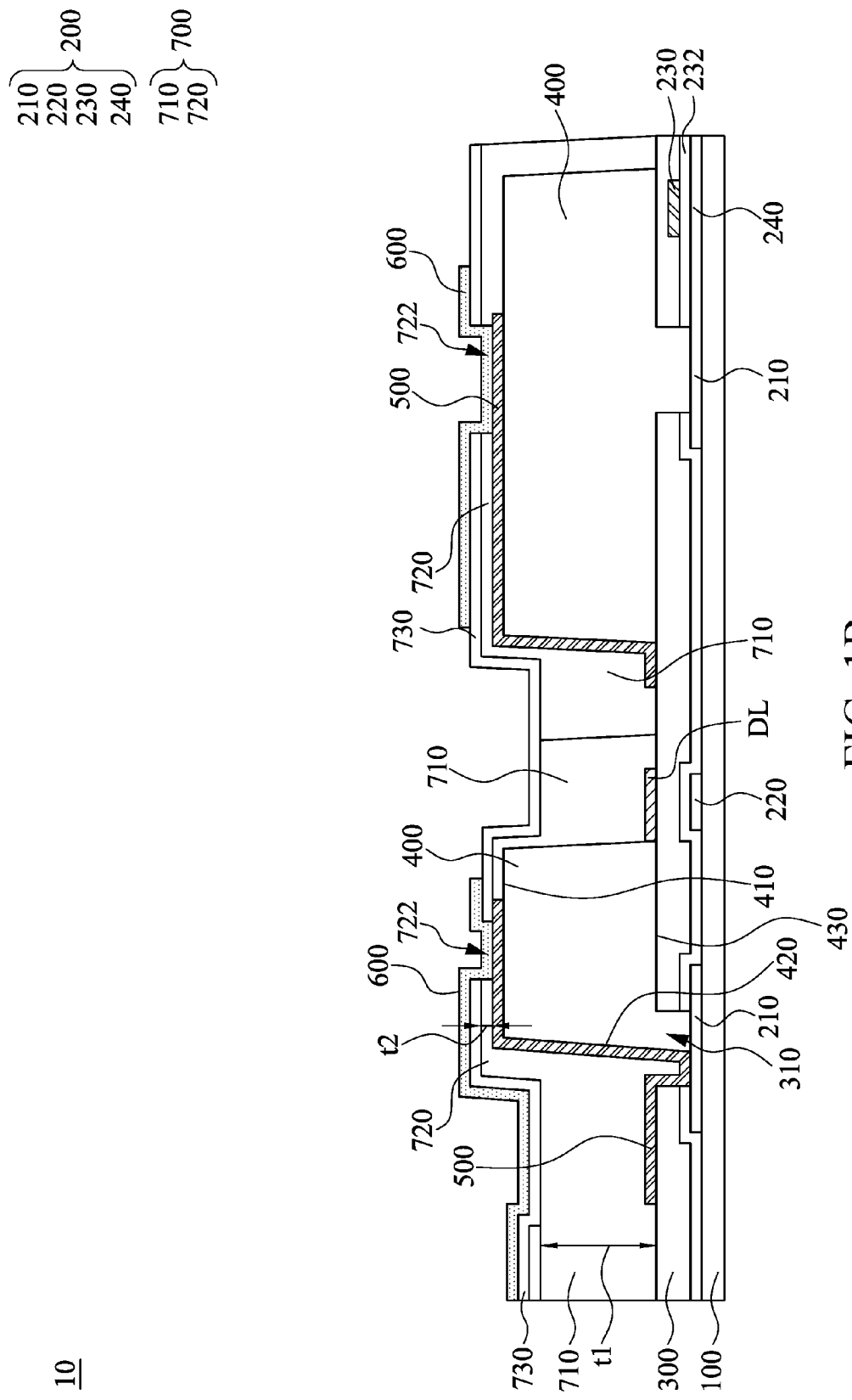
FIG. 1B is a schematic cross-sectional view along a line segment 1B-1B' of FIG. 1A.

Referring to both FIG. 1A and FIG. 1B, FIG. 1A is a schematic top view of an active device array substrate 10 according to some embodiments of the present disclosure; and FIG. 1B is a schematic cross-sectional view along a line segment 1B-1B' of FIG. 1A. It should be noted that the line segment 1B-1B' herein is a broken line having two turning angles. The active device array substrate 10 includes: a substrate 100, at least one switch device 200, an inter-layer dielectric layer 300, at least one insulation bump 400, at least one conductive layer 500, and at least one pixel electrode 600. The at least one switch device 200 is located on the substrate 100. The inter-layer dielectric layer 300 is located on the switch device 200, and the inter-layer dielectric layer 300 has at least one opening 310, where the opening 310 does not cover at least one part of a drain electrode 210 of the switch device 200. In other words, the opening 310 exposes at least one part of the drain electrode 210 of the switch device 200. The at least one insulation bump 400 covers at least partially the opening 310. The at least one conductive layer 500 is located on a top surface 410 and a side wall 420 of the insulation bump 400, and is electrically connected to the drain electrode 210 of the switch device 200 through the opening 310. The at least one pixel electrode 600 is electrically connected to the conductive layer 500. In this way, the conductive layer 500 may extend from the drain electrode 210 of the switch device 200 up to the pixel electrode 600 by using the insulation bump 400 as an overlapping structure of the conductive layer 500, so that the drain electrode 210 of the switch device 200 is electrically connected to the pixel electrode 600.

More specifically, the insulation bump 400 may cover at least one part of the switch device 200. Therefore, overall sizes of the switch device 200 and the insulation bump 400 in a horizontal direction D1 may be downscaled. That is, as shown in the top view of FIG. 1A, area proportions occupied by the switch device 200 and the insulation bump 400 in a pixel region PR of the active device array substrate 10 may be also reduced. Therefore, an aperture opening ratio of the pixel region PR may be increased, and this is also beneficial to downscaling a size of the pixel region PR of the active device array substrate 10, thereby improving resolution of a display device using the active device array substrate 10. In other words, a vertical projection of the pixel electrode 600 onto the substrate 100 may cover at least one part of the device 200, so as to increase a proportion occupied by the pixel electrode 600 in the pixel region PR of the active device array substrate 10, thereby increasing the aperture opening ratio of the pixel region PR.

Specifically, in some embodiments, as shown in FIG. 1B, the insulation bump 400 includes the top surface 410 and a bottom surface 430 that are opposite to each other, and the side wall 420 is connected to the top surface 410 and the bottom surface 430. The bottom surface 430 is located at least partially in the opening 310 of the inter-layer dielectric layer 300, and is directly in contact with a part of the drain electrode 210 of the switch device 200. Another part of the bottom surface 430 may be located on the inter-layer dielectric layer 300 and may be directly in contact with the inter-layer dielectric layer 300. A projection area of the top surface 410 on the substrate 100 may be less than or equal to a projection area of the bottom surface 430 on the substrate 100, and an angle between the side wall 420 and the bottom surface 430 may be an acute angle or may be approximately a right angle. That is, the side wall 420 may be slant. The conductive layer 500 may be formed along the side wall 420, and extend up to the top surface 410 of the insulation bump 400 and down to the opening 310 of the inter-layer dielectric layer 300. Therefore, the conductive layer 500 does not generate any gap or broken line. In other words, a cross-sectional shape of the insulation bump 400 may be a trapezoid whose upper base is shorter than a lower base or may be approximately a square. This is beneficial to connecting the drain electrode 210 to the pixel electrode 600 by the conductive layer 500. However, the present disclosure is not limited thereto.

In some embodiments, a material of the insulation bump 400 may be an organic material such as acrylic resin, an acrylate monomer, 3-methoxybutyl acetate, propylene glycol methyl ether acetate, another similar material, or a combination of the foregoing. However, the present disclosure is not limited thereto. In some embodiments, the top surface 410 of the insulation bump 400 is a flat surface. This is beneficial to subsequent formation of the pixel electrode 600. The insulation bump 400 may include the flat top surface 410. Therefore, the pixel electrode 600 may be prevented from generating a gap or a broken line in a forming process.

In some embodiments, the switch device 200 may be a thin-film transistor (TFT). The switch device 200 has the drain electrode 210, a source electrode 220, a gate 230, and an active layer 240. The drain electrode 210 and the source electrode 220 are correspondingly disposed on left and right sides of the substrate 100; and the gate 230 and the active layer 240 are disposed on the substrate 100 in a manner of vertically corresponding to each other. For example, in some embodiments, as shown in 1B, the active layer 240 is disposed on the substrate 100, and the gate 230 is disposed on the active layer 240. This configuration is a top gate transistor structure. In other embodiments, the switch device 200 may be a bottom gate transistor structure, that is, the gate 230 is located under the active layer 240. Optionally, the switch device 200 may be another type of thin-film transistor component, for example, an island stop (IS) thin-film transistor component or a coplanar thin-film transistor component. However, the present disclosure is not limited thereto. It should be learnt that the switch device 200 may be set according to various common methods in the field, and a scope of the present disclosure should not be limited by what is drawn in the figures.

In some embodiments, the active layer 240 may be various semi-conductive materials, for example, polycrystalline silicon, monocrystalline silicon, microcrystalline silicon, noncrystalline silicon, an organic semi-conductive material, a metal-oxide semi-conductive material, another appropriate material, or a combination of at least two of the foregoing materials. The present disclosure is not limited thereto. In some embodiments, multiple insulation layers are further disposed on the substrate 100, for example, a gate dielectric layer 232 located between the active layer 240 and the gate 230, to help the configuration of the switch device 200. The inter-layer dielectric layer 300 may cover the drain electrode 210, the source electrode 220, and the gate 230 of the switch device 200, to protect the switch device 200.

In some embodiments, as shown in FIG. 1A, the active device array substrate 10 further includes a data line DL and a scanning line SL. The data line DL is electrically connected to the source electrode 220 of the switch device 200. The scanning line SL is electrically connected to the gate 230 of the switch device 200. The data line DL and the scanning line SL are interleaved, to define at least one pixel region PR of the active device array substrate 10. Herein, the active device array substrate 10 may be provided with multiple pixel regions PRs that are arranged in an array manner. The switch device 200, the data line DL, the scanning line SL, and the pixel electrode 600 are electrically connected to each other, and the switch device 200 may conduct the data line DL and the pixel electrode 600 under control of a signal of the scanning line SL.

In some embodiments, a vertical projection of the insulation bump 400 onto the substrate 100 and a vertical projection of the active layer 240 of the switch device 200 onto the substrate 100 overlap at least partially. That is, the insulation bump 400 is located at least partially directly above the active layer 240 of the switch device 200. As shown in FIG. 1A, a shape of the insulation bump 400 may be a square in the top view, and the insulation bump 400 may cross the active layer 240 of the switch device 200 along a direction of the data line DL. In other embodiments, the shape of the insulation bump 400 may be a circle, an ellipse, a polygon, or the like in the top view, but the present disclosure is not limited thereto. In other words, as shown in a right half part of FIG. 1B, a vertical projection of the insulation bump 400 onto the bottom surface of the inter-layer dielectric layer 300 overlaps with the gate 230 of the switch device 200. The active layer 240 is disposed in correspondence to the gate 230. Therefore, the vertical projection of the insulation bump 400 onto the bottom surface of the inter-layer dielectric layer 300 also overlaps with a vertical projection of the active layer 240 onto the bottom surface of the inter-layer dielectric layer 300.

In some embodiments, as shown in FIG. 1B, the active device array substrate 10 further includes at least one color filter layer 700. The color filter layer 700 is located at least partially between the pixel electrode 600 and the inter-layer dielectric layer 300. The color filter layer 700 may be a red filter layer, a green filter layer, a blue filter layer, or a filter layer of another color. However, the present disclosure is not limited thereto. Herein, by using a color filter on array (COA) technology, that is, the color filter layer 700 is disposed in the active device array substrate 10, a problem that a conventional color filter substrate and the active device array substrate cannot be easily aligned is improved. However, the present disclosure is not limited thereto.

In some embodiments, as shown in FIG. 1B, the color filter layer 700 has a first part 710 and a second part 720 that are opposite to each other. The first part 710 is located on the inter-layer dielectric layer 300, and the second part 720 is located on the insulation bump 400. In other words, the color filter layer 700 may surround the insulation bump 400, the first part 710 may be disposed adjacent to the side wall 420 of the insulation bump 400, and the second part 720 may be disposed on the top surface 410 of the insulation bump, so that a horizontal height of the first part 710 is less than a horizontal height of the second part 720. In some embodiments, the first part 710 and the second part 720 may be respectively in contact with the conductive layer 500 of the side wall 420 of the insulation bump 400 and the conductive layer 500 of the top surface 410 of the insulation bump 400, so as to increase an area occupied by the color filter layer 700 in the active device array substrate 10, thereby increasing the aperture opening ratio of the pixel region PR.

More specifically, the first part 710 mainly provides a display color of the display device, and the second part 720 needs to provide a contact hole 722. The contact hole 722 may not cover at least one part of the conductive layer 500, so that the pixel electrode 600 may be connected to the conductive layer 500 through the contact hole 722, and be electrically connected to the drain electrode 210 of the switch device 200. The first part 710 has a first thickness t1. The second part 720 has a second thickness t2. The first thickness t1 of the first part 710 is greater than the second thickness t2 of the second part 720. Therefore, the first part 710 may effectively provide a display color of the pixel region PR. In addition, the second thickness t2 of the second part 720 is less than the first thickness t1 of the first part 710. Therefore, a size of the contact hole 722 formed on the second part 720 may also be relatively small, and a manufacturing time of the contact hole 722 may be reduced.

In some embodiments, the pixel electrode 600 may be disposed on the first part 710 and the second part 720 of the color filter layer 700. That is, the color filter layer 700 may be used as an overlapping structure of the pixel electrode 600, so that the pixel electrode 600 may be electrically connected to the conductive layer 500. In some embodiments, the active device array substrate 10 further includes a protection layer 730. The protection layer 730 may be disposed between the color filter layer 700 and the pixel electrode 600, to protect the color filter layer 700 and the pixel electrode 600. However, the present disclosure is not limited thereto.

Figure 2A:
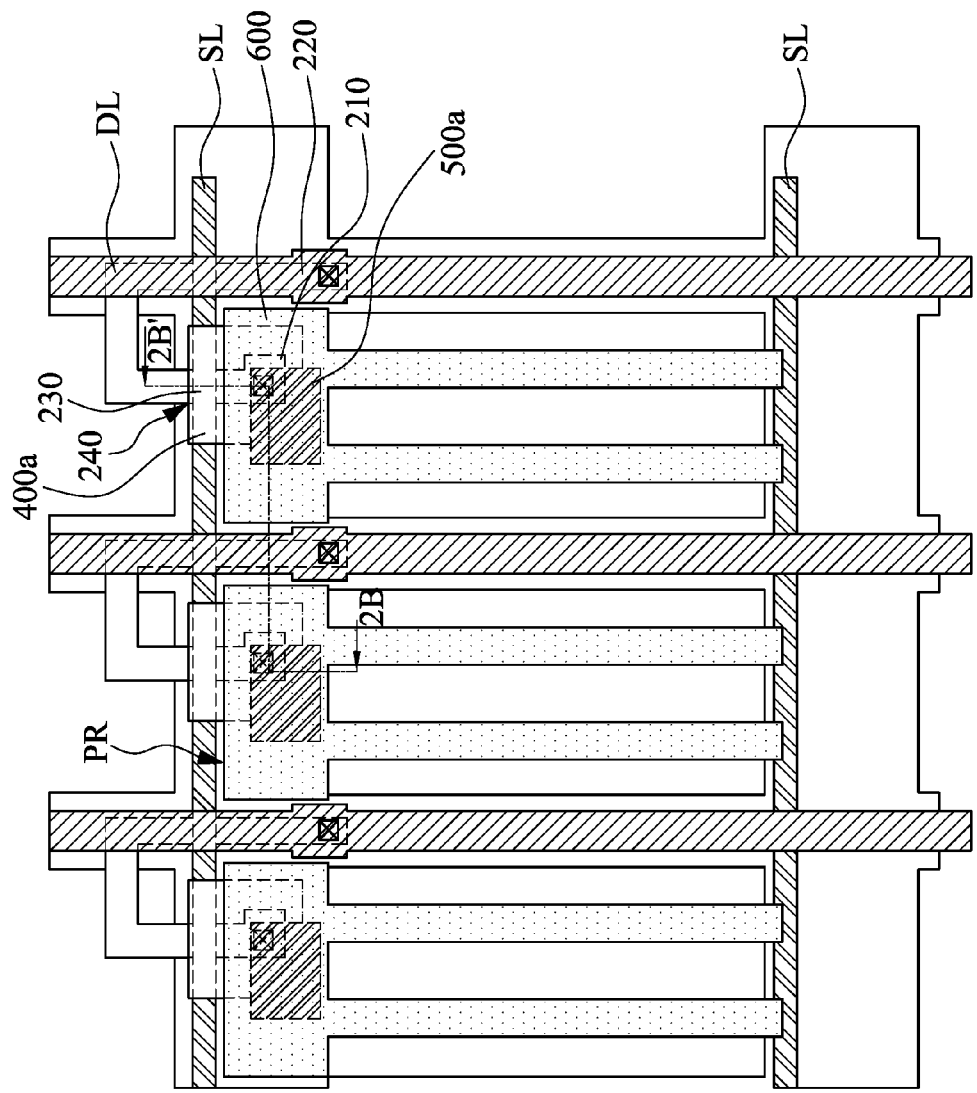
FIG. 2A is a schematic top view of an active device array substrate according to some embodiments of the present disclosure.
Figure 2B:
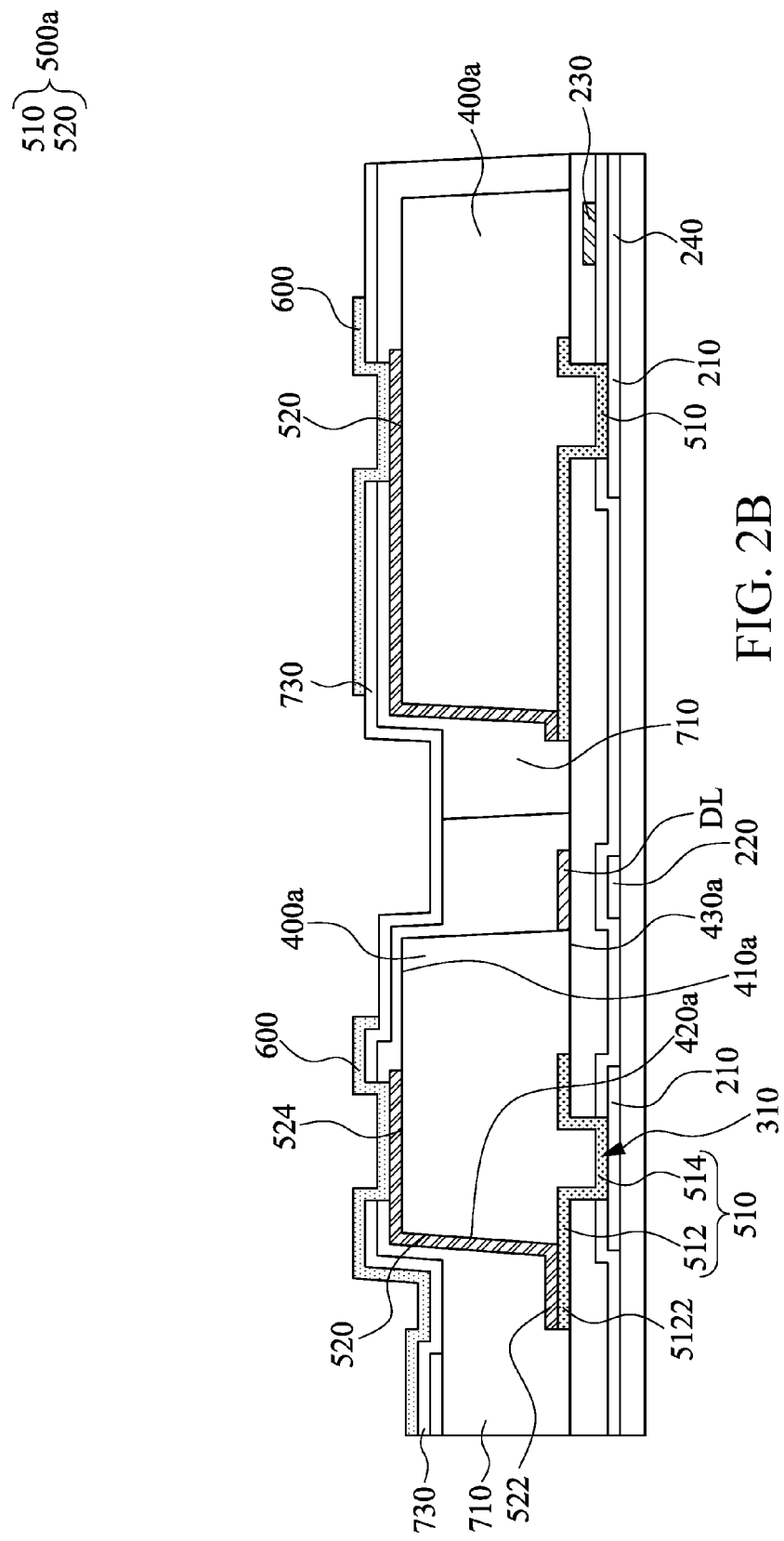
FIG. 2B is a schematic cross-sectional view along a line segment 2B-2B' of FIG. 2A.

Referring to FIG. 2A and FIG. 2B, FIG. 2A is a schematic top view of an active device array substrate 10a according to some embodiments of the present disclosure; and FIG. 2B is a schematic cross-sectional view along a line segment 2B-2B' of FIG. 2A. A main difference between this embodiment and the foregoing embodiment is that a conductive layer 500a includes a first conductive sub-layer 510 and a second conductive sub-layer 520. The first conductive sub-layer 510 is located at least partially on an inter-layer dielectric layer 300, and is electrically connected to a drain electrode 210 of a switch device 200 through an opening 310. An insulation bump 400a partially covers the first conductive sub-layer 510, but the first conductive sub-layer 510 has an overlapping portion 5122 that is not covered by the insulation bump 400a. The second conductive sub-layer 520 is located at least partially on a top surface 410a and a side wall 420a of the insulation bump 400a, and is electrically connected to the overlapping portion 5122 of the first conductive sub-layer 510. In this way, the first conductive sub-layer 510 may be electrically connected to the drain electrode 210 of the switch device 200. The second conductive sub-layer 520 may be electrically connected to the overlapping portion 5122 of the first conductive sub-layer 510. A pixel electrode 600 may be electrically connected to the second conductive sub-layer 520. Therefore, the pixel electrode 600 may be electrically connected to the drain electrode 210 of the switch device 200.

More specifically, in some embodiments, as shown in FIG. 2B, the first conductive sub-layer 510 may include a first sub-portion 512 and a second sub-portion 514 that are opposite to each other. The first sub-portion 512 is disposed on the inter-layer dielectric layer 300. The second sub-portion 514 is disposed in the opening 310 of the inter-layer dielectric layer 300, to get electrically connected to the drain electrode 210 of the switch device 200. The first sub-portion 512 and the second sub-portion 514 are integrally formed and are electrically connected to each other. The first sub-portion 512 includes the overlapping portion 5122 that is not covered by the insulation bump 400a. For example, in some embodiments, the second sub-portion 514 of the first conductive sub-layer 510 may completely cover the opening 310, or partially cover the opening 310. However, the present disclosure is not limited thereto. In some embodiments, the first sub-portion 512 of the first conductive sub-layer 510 may be located on the inter-layer dielectric layer 300 on opposite two sides of the opening 310. However, the present disclosure is not limited thereto.

In some embodiments, the second conductive sub-layer 520 may include a first end 522 and a second end 524 that are opposite to each other. The first end 522 is disposed on the inter-layer dielectric layer 300. The first end 522 is electrically connected to the overlapping portion 5122 of the first sub-portion 512 of the first conductive sub-layer 510, so that the first conductive sub-layer 510 is electrically connected to the second conductive sub-layer 520. Therefore, the second conductive sub-layer 520 may be electrically connected to the switch device 200. The second end 524 of the second conductive sub-layer 520 is disposed on the insulation bump 400a. The pixel electrode 600 covers the second end 524 of the second conductive sub-layer 520. The pixel electrode 600 is electrically connected to the second conductive sub-layer 520. Further, the pixel electrode 600 may be electrically connected to the switch device 200. Therefore, the switch device 200 may conduct the pixel electrode 600 and a data line DL under control of a signal of a scanning line SL, to control each pixel region PR.

In some embodiments, as shown in FIG. 2B, the insulation bump 400a completely covers the opening 310. The insulation bump 400a includes the top surface 410a and a bottom surface 430a that are opposite to each other, and the side wall 420a. A part of the bottom surface 430a is completely disposed in the opening 310 of the inter-layer dielectric layer 300 and completely covers the second sub-portion 514 of the first conductive sub-layer 510. Another part of the bottom surface 430a is disposed on the inter-layer dielectric layer 300, and partially covers the first sub-portion 512 of the first conductive sub-layer 510, and the first sub-portion 512 has the overlapping portion 5122 that is not covered by the insulation bump 400a. In this way, by means of configurations of the first conductive sub-layer 510 and the second conductive sub-layer 520, on the premise of not affecting a connection between the pixel electrode 600 and the switch device 200, the insulation bump 400a may completely cover the opening 310 of the inter-layer dielectric layer 300, so that a set location and a size of the insulation bump 400a are more flexible and not limited, so as to apply the insulation bump 400a to pixel regions PRs having different sizes. Other details of this embodiment are approximately the same as what stated above, and are not described herein again.

Figure 3A:
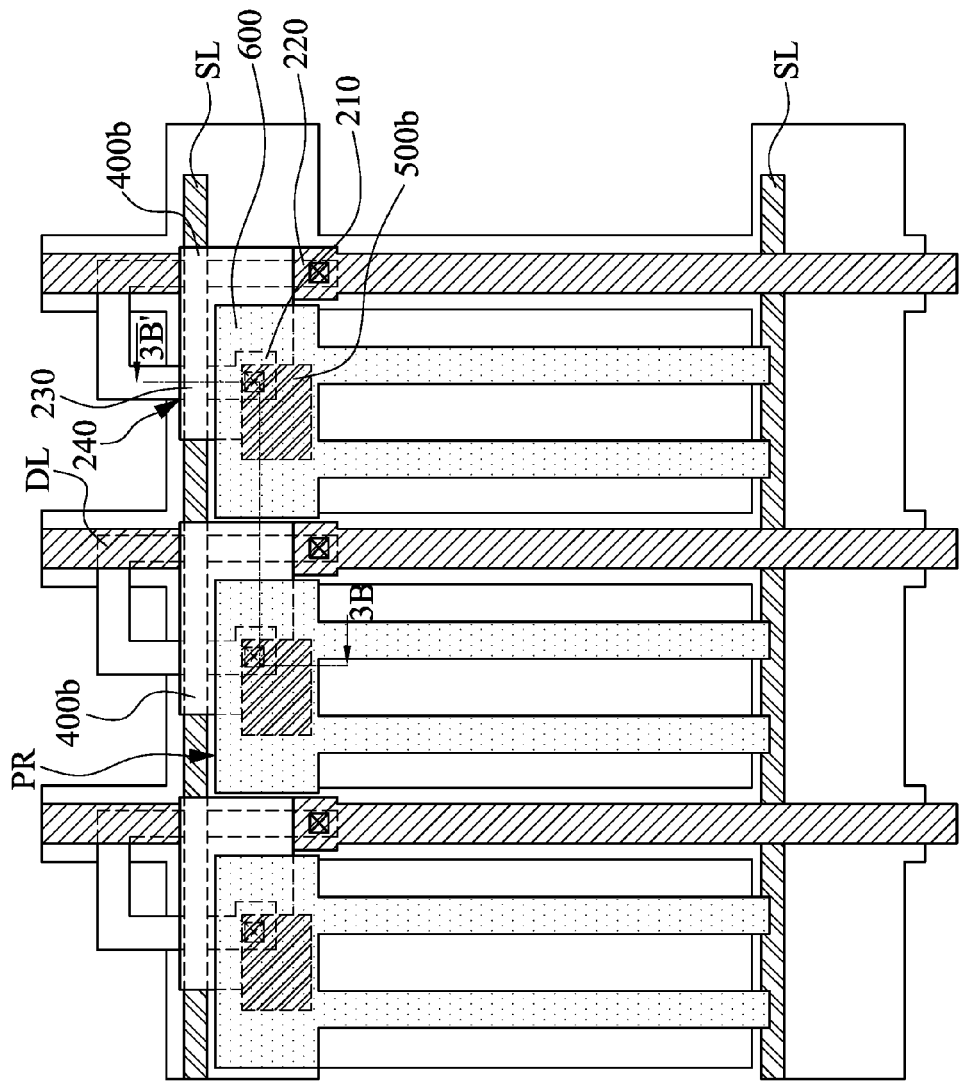
FIG. 3A is a schematic top view of an active device array substrate according to some embodiments of the present disclosure.
Figure 3B:
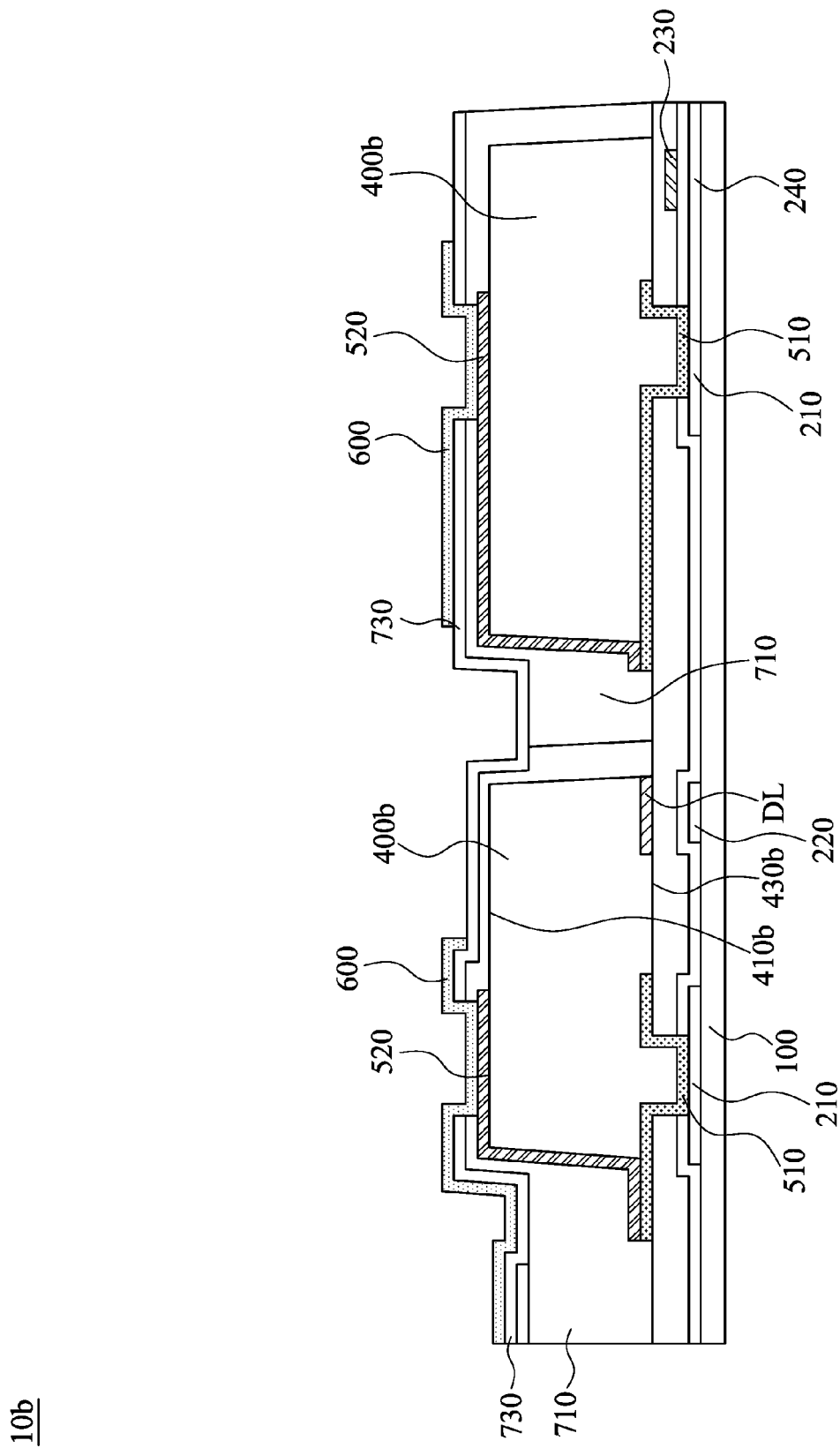
FIG. 3B is a schematic cross-sectional view along a line segment 3B-3B' of FIG. 3A.

Referring to FIG. 3A and FIG. 3B, FIG. 3A is a schematic top view of an active device array substrate 10b according to some embodiments of the present disclosure; and FIG. 3B is a schematic cross-sectional view along a line segment 3B-3B' of FIG. 3A. A main difference between this embodiment and the foregoing embodiment is that a vertical projection of an insulation bump 400b onto a substrate 100 overlaps at least partially with a vertical projection of a data line DL onto the substrate 100. As shown in FIG. 3A, the insulation bump 400b may cross directly above the data line DL along a direction of a scanning line SL. More specifically, as shown in FIG. 3B, a bottom surface 430b of the insulation bump 400b covers at least partially the data line DL. For example, in some embodiments, the bottom surface 430b of the insulation bump 400b may completely cover the data line DL, or may partially cover the data line DL. However, the present disclosure is not limited thereto. In addition, referring to both FIG. 2A and FIG. 3A, an area of a top surface 410b of the insulation bump 400b is different from an area of the top surface 410a of the insulation bump 400a. That is, the insulation bump 400b occupies a different area proportion in the active device array substrate 10b. For example, in some embodiments, the area of the top surface 410b of the insulation bump 400b may be greater than the area of the top surface 410a of the insulation bump 400a. However, the present disclosure is not limited thereto. In view of the above, the insulation bump 400b may be disposed on the data line DL in an overlapping manner, so that a set location and a size of the insulation bump 400b and a pixel size are more flexible and not limited, so as to apply the insulation bump 400b to a pixel region PR having higher resolution. Other details of this embodiment are approximately the same as what stated above, and are not described herein again.

Figure 4A:
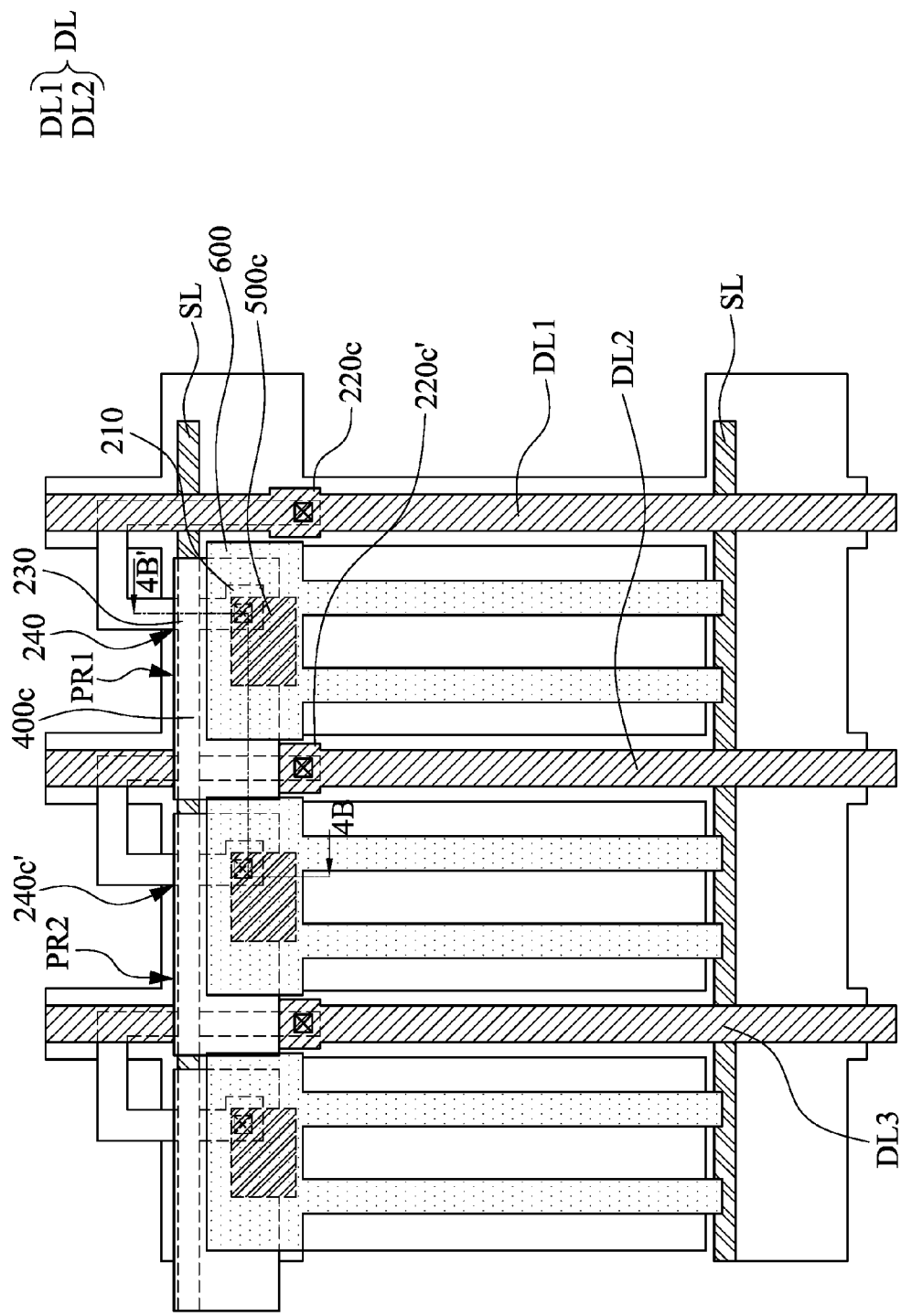
FIG. 4A is a schematic top view of an active device array substrate according to some embodiments of the present disclosure.
Figure 4B:
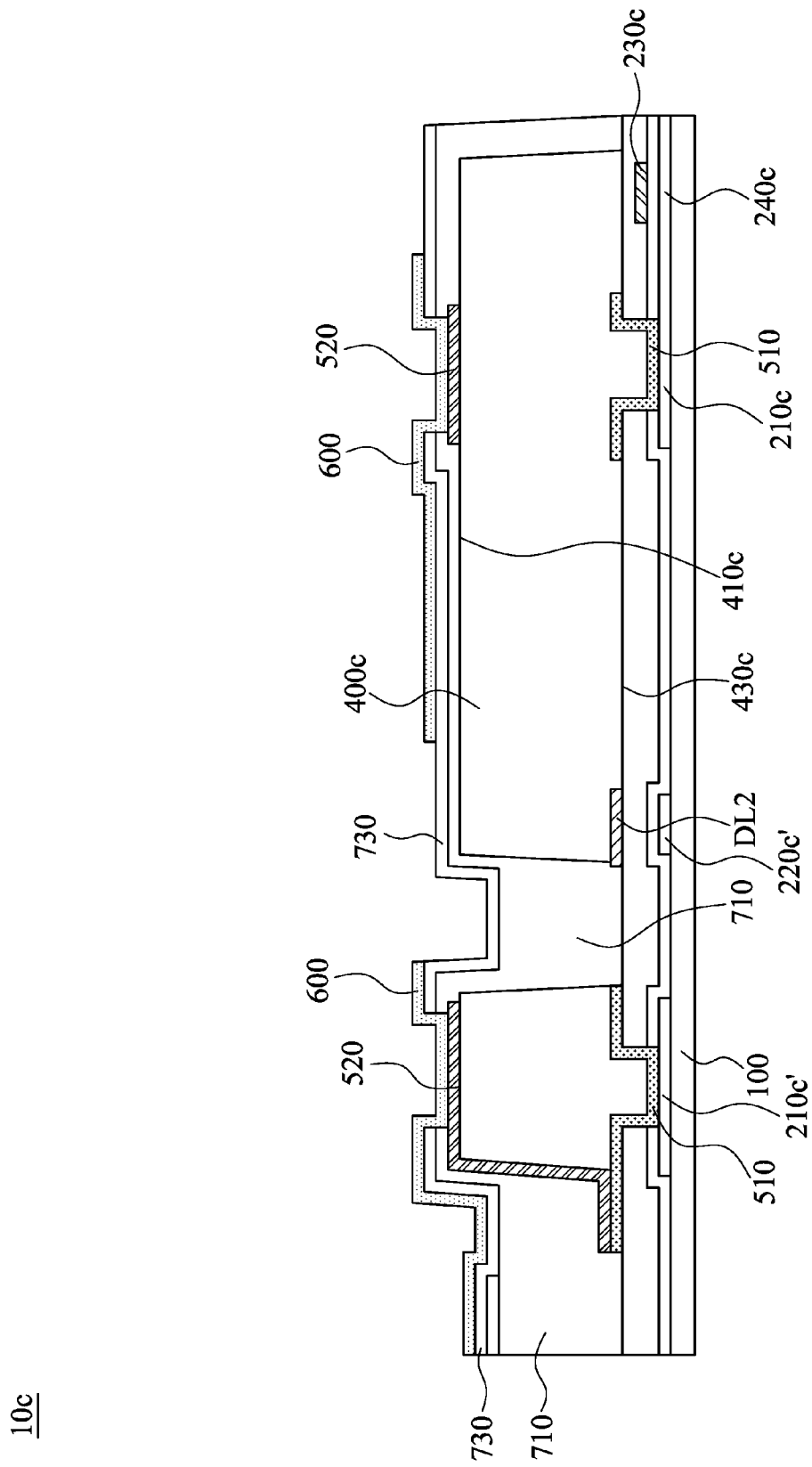
FIG. 4B is a schematic cross-sectional view along a line segment 4B-4B' of FIG. 4A.

Referring to FIG. 4A and FIG. 4B, FIG. 4A is a schematic top view of an active device array substrate 10c according to some embodiments of the present disclosure; and FIG. 4B is a schematic cross-sectional view along a line segment 4B-4B' of FIG. 4A. A main difference between this embodiment and the foregoing embodiment is that an insulation bump 400c may be disposed on two adjacent switch devices 200 (200c and 200c'). As shown in FIG. 4A, a first data line DL1, a second data line DL2, and a scanning line SL may define a first pixel region PR1 together. Similarly, the second data line DL2, a third data line DL3, and the scanning line SL may define a second pixel region PR2 together. The first pixel region PR1 has the switch device 200c. The second pixel region PR2 has the switch device 200c'. The first pixel region PR1 is adjacent to the second pixel region PR2. The first data line DL1 is electrically connected to a source electrode 220c of the switch device 200c. The second data line DL2 is adjacent to the switch device 200c. The second data line DL2 is electrically connected to a source electrode 220c' of the switch device 200c'. A vertical projection of the insulation bump 400c onto a substrate 100 and a vertical projection of the second data line DL2 onto the substrate 100 overlap at least partially. In other words, the insulation bump 400c may be disposed above the source electrode 220c' of the switch device 200c' and a drain electrode 210c of the switch device 200c along a direction of the scanning line SL. That is, the insulation bump 400c may cross the first pixel region PR1 and the second pixel region PR2, and the insulation bump 400c may cover the two adjacent switch devices 200 (200c and 200c').

As shown in FIG. 4B, a bottom surface 430c of the insulation bump 400c covers at least partially the second data line DL2. For example, in some embodiments, the bottom surface 430c of the insulation bump 400c may completely cover the second data line DL2, or may partially cover the second data line DL2. However, the present disclosure is not limited thereto. Other details of this embodiment are approximately the same as what stated above, and are not described herein again.

Figure 5:
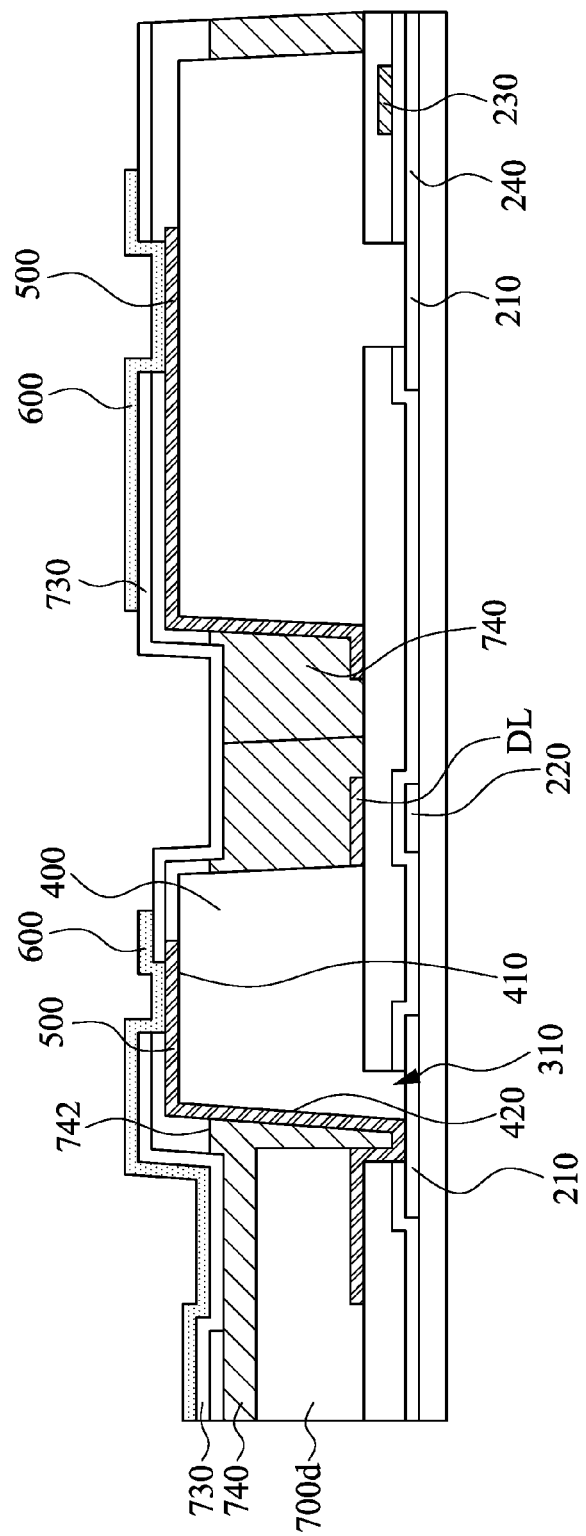
FIG. 5 is a schematic cross-sectional view along a line segment 1B-1B' of FIG. 1A according to another embodiment.

Referring to FIG. 5, FIG. 5 is a schematic cross-sectional view along a line segment 1B-1B' of FIG. 1A according to another embodiment. A main difference between this embodiment and the embodiment in FIG. 1B is that an active device array substrate 10d further includes at least one coverage layer 740. The coverage layer 740 is adjacent to an insulation bump 400, where a top surface 742 of the coverage layer 740 is lower than a top surface 410 of the insulation bump 400. Specifically, the coverage layer 740 is adjacent to a side wall 420 of the insulation bump 400, and the coverage layer 740 is located on a color filter layer 700d. For example, in some embodiments, the coverage layer 740 may be partially disposed in an opening 310 of an inter-layer dielectric layer 300. The coverage layer 740 may be located on the inter-layer dielectric layer 300, or the coverage layer 740 may be located between two adjacent insulation bumps 400. However, the present disclosure is not limited thereto. In some embodiments, the coverage layer 740 may be referred to as a flat layer. A material of the coverage layer 740 may include an inorganic insulation material, an organic insulation material, an organic photosensitive material, or another appropriate material. However, the present disclosure is not limited thereto. The coverage layer 740 may be used to compensate for a height difference between color filter layers 700d of a pixel region PR, thereby reducing brightness unevenness of a display device using the active device array substrate 10d.

Figure 6:
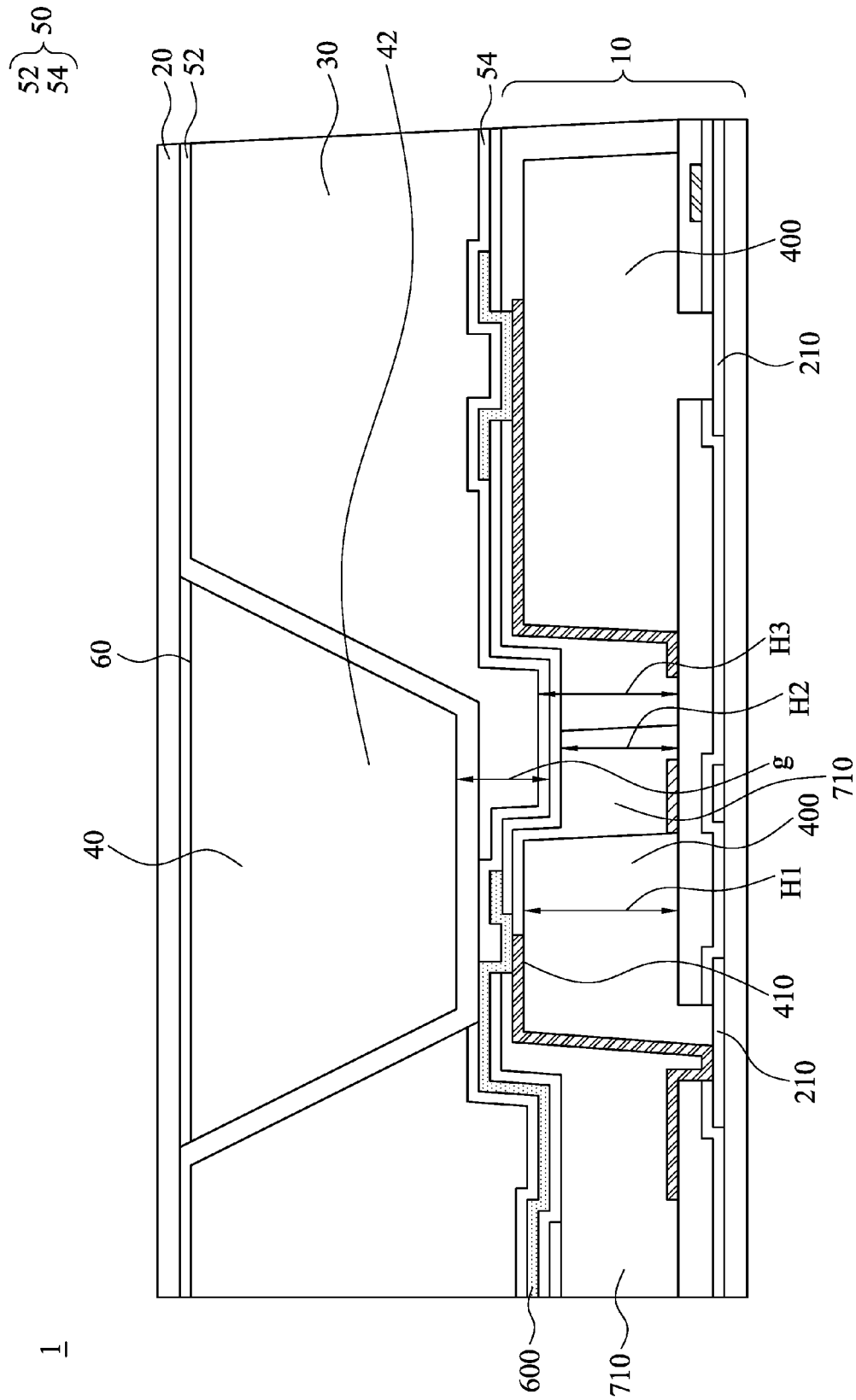
FIG. 6 is a schematic cross-sectional view of a display device 1 according to some embodiments of the present disclosure.

Referring to FIG. 6, FIG. 6 is a schematic cross-sectional view of a display device 1 according to some embodiments of the present disclosure. A visual angle of FIG. 6 is the same as that of FIG. 1B. In some embodiments of the present disclosure, a method for manufacturing the display device 1 includes the following steps: forming an opposing substrate 20; and forming at least one spacer 40 between an active device array substrate 10 and the opposing substrate 20, where the spacer is located at least partially on an insulation bump 400. Specifically, in some embodiments, the spacer 40 is disposed at least partially on the insulation bump 400, and a display medium layer 30 is provided. Subsequently, a structure of the display device 1 shown in FIG. 6 may be completed by combining the active device array substrate 10 and the opposing substrate 20. For example, in some embodiments, the opposing substrate 20 may be a transparent substrate, a hard substrate, or a flexible substrate, for example, glass, tempered glass, polycarbonate (PC), polyethylene terephthalate (PET), or another cyclic olefin copolymer. However, the present disclosure is not limited thereto. In some embodiments, a quantity and configuration density of spacers 40 may be adjusted according to needs.

In some embodiments, the active device array substrate 10 (10a, 10b, 10c, or 10d) may be applied to the display device 1. Specifically, the display device 1 includes the active device array substrate 10, the opposing substrate 20, the display medium layer 30, and the at least one spacer 40. The display medium layer 30 is located between the active device array substrate 10 and the opposing substrate 20. The spacer 40 is located between the active device array substrate 10 and the opposing substrate 20, and is located at least partially on the insulation bump 400. The spacer 40 may be used to support the opposing substrate 20, so that there is a thickness between the opposing substrate 20 and the active device array substrate 10. Therefore, the display medium layer 30 may be accommodated between the opposing substrate 20 and the active device array substrate 10. In addition, the spacer 40 is disposed partially on the insulation bump 400, and a horizontal height H1 of a top surface 410 of the insulation bump 400 is greater than a horizontal height H2 of a first part 710 of a color filter layer 700, that is, the spacer 40 located on the insulation bump 400 and the first part 710, located under the spacer 40, of the color filter layer 700 have a height difference. Therefore, upon impact of an external force, the spacer 40 does not easily generate a relative friction with the active device array substrate 10 under the spacer 40, so as to prevent the spacer 40 from generating an undesirable scrap (for example, a scrap of an alignment layer, which is further described below) due to the friction, thereby reducing a shimmering bright dot or light leakage of the display device 1.

In some embodiments, the display device 1 further includes an alignment layer 50. The alignment layer 50 is separately disposed between the display medium layer 30 and the active device array substrate 10, between the display medium layer 30 and the opposing substrate 20, and between the insulation bump 400 and the display medium layer 30. More specifically, the alignment layer 50 may be classified into a first alignment layer 52 and a second alignment layer 54 that are opposite to each other. The first alignment layer 52 may be directly in contact with the opposing substrate 20 and the spacer 40, and the second alignment layer 54 may be in contact with the active device array substrate 10. The spacer 40 is disposed partially on the insulation bump 400, and the horizontal height H1 of the top surface 410 of the insulation bump 400 is greater than a horizontal height H3 of the second alignment layer 54 on the first part 710 of the color filter layer 700. Therefore, upon impact of an external force, the spacer 40 does not easily hit the second alignment layer 54, so as to prevent the second alignment layer 54 from being peeled off, thereby reducing the shimmering bright dot or the light leakage of the display device 1.

More specifically, as shown in FIG. 6, the spacer 40 has a suspension portion 42 that is not supported by the insulation bump 400, so that there is a gap g between the suspension portion 42 and the active device array substrate 10. In some embodiments, the gap g may fill the display medium layer 30. However, the present disclosure is not limited thereto. In view of the above, the active device array substrate 10 and the spacer 40 are at least partially separated from each other, and not in contact with each other, that is, there is at least one gap g between the active device array substrate 10 and a part of the spacer 40. In this way, when the display device 1 is hit by an external force, the spacer 40 may possibly generate relative displacement. However, there is the gap g between the suspension portion 42 of the spacer 40 and the active device array substrate 10, and the suspension portion 42 does not easily rub the second alignment layer 54 under the suspension portion 42. Therefore, the second alignment layer 54 can be prevented from being undesirably peeled off, thereby reducing the shimmering bright dot or the light leakage of the display device 1.

In some embodiments, the alignment layer 50 may provide a vertical alignment force for the display medium layer 30 and also provide, with an electrode, multiple pretilt angles having different definitional domains. For example, in some embodiments, a material of the alignment layer 50 may be a polymer-stabilized material. However, the present disclosure is not limited thereto.

In some embodiments, the spacer 40 may be a three-dimensional trapezoid. As shown in FIG. 6B, a cross-sectional shape of the spacer 40 is a trapezoid, and an area of a bottom surface is greater than an area of a top surface. In addition, in addition to a supporting effect, the spacer 40 may be formed of an opaque material to provide the supporting effect as well as a light-shielding effect. For example, in some embodiments, the spacer 40 may be a photo spacer. However, the present disclosure is not limited thereto.

In some embodiments, a light-shielding pattern 60 (for example, a black matrix) may be further disposed on the opposing substrate 20. The opposing substrate 20 and the active device array substrate 10 are disposed in correspondence with each other, and materials of the opposing substrate 20 and the active device array substrate 10 may be the same or different. In some embodiments, if the active device array substrate 10 has a color filter layer, the opposing substrate 20 may not need to be provided with a color filter layer. In other embodiments, if the active device array substrate 10 does not have a color filter layer, the opposing substrate 20 needs to be provided with a color filter layer. However, the present disclosure is not limited thereto.

Figure 7A:
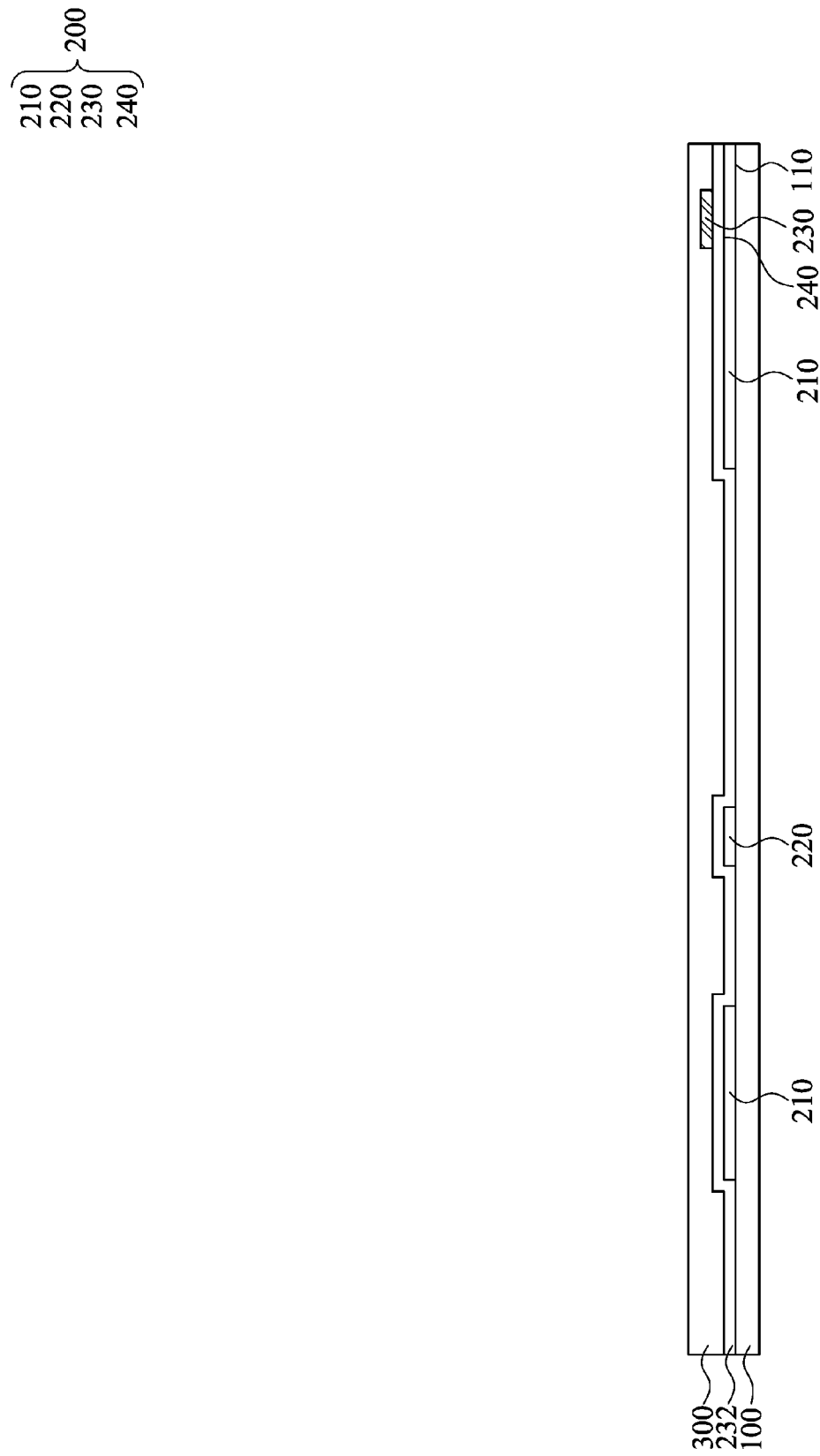
FIG. 7A, FIG. 7B, FIG. 7C, and FIG. 7D respectively show cross-sectional views of different stages of an active device array substrate in a manufacturing procedure according to some embodiments of the present disclosure, where a cross-sectional location corresponds to a line segment 1B-1B' in FIG. 1A.

Referring to FIG. 7A, FIG. 7B, FIG. 7C, and FIG. 7D, FIG. 7A, FIG. 7B, FIG. 7C, and FIG. 7D show cross-sectional views of different stages of an active device array substrate in a manufacturing procedure according to some embodiments of the present disclosure, where a cross-sectional location corresponds to a line segment 1B-1B' in FIG. 1A. In some embodiments of the present disclosure, a method for manufacturing an active device array substrate 10 includes the following steps:

Referring to FIG. 7A, at least one switch device 200 is formed on a substrate 100, and an inter-layer dielectric layer 300 is formed on the switch device 200. In some embodiments, the substrate 100 may be glass, quartz, a polymer material (for example, polyimide (PI)), benzocyclobutene (BCB), polycarbonate (PC), another appropriate material, or a combination of the foregoing materials. However, the present disclosure is not limited thereto. In some embodiments, the switch device 200 may be a thin-film transistor. For example, a drain electrode 210, a source electrode 220, and an active layer 240 are formed on a top surface 110 of the substrate 100. Subsequently, a gate dielectric layer 232 covers the drain electrode 210, the source electrode 220, and the active layer 240. Then the gate 230 is correspondingly formed on the active layer 240. A configuration of the switch device 200 is finally completed together. In some embodiments, the inter-layer dielectric layer 300 may be configured to protect the switch device 200. For example, a material of the inter-layer dielectric layer 300 may be silicon oxide, silicon nitride, silicon oxynitride (SiNxOy), another appropriate dielectric material, or a combination of the foregoing materials. However, the present disclosure is not limited thereto.

Figure 7B:
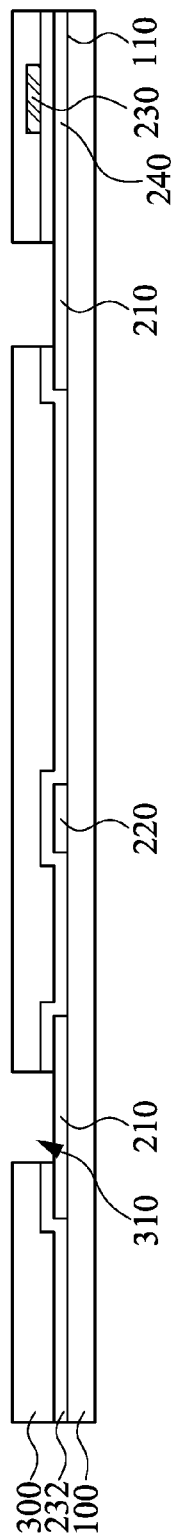

Referring to FIG. 7B, at least one opening 310 is formed in the inter-layer dielectric layer 300, and the opening 310 does not cover at least one part of the drain electrode 210 of the switch device 200. That is, the opening 310 exposes at least one part of the drain electrode 210 of the switch device 200. Specifically, an appropriate photolithography manufacturing procedure and etching manufacturing procedure are performed on the inter-layer dielectric layer 300, to form a patterned hole on the inter-layer dielectric layer 300 above the drain electrode 210, that is, the opening 310.

Figure 7C:
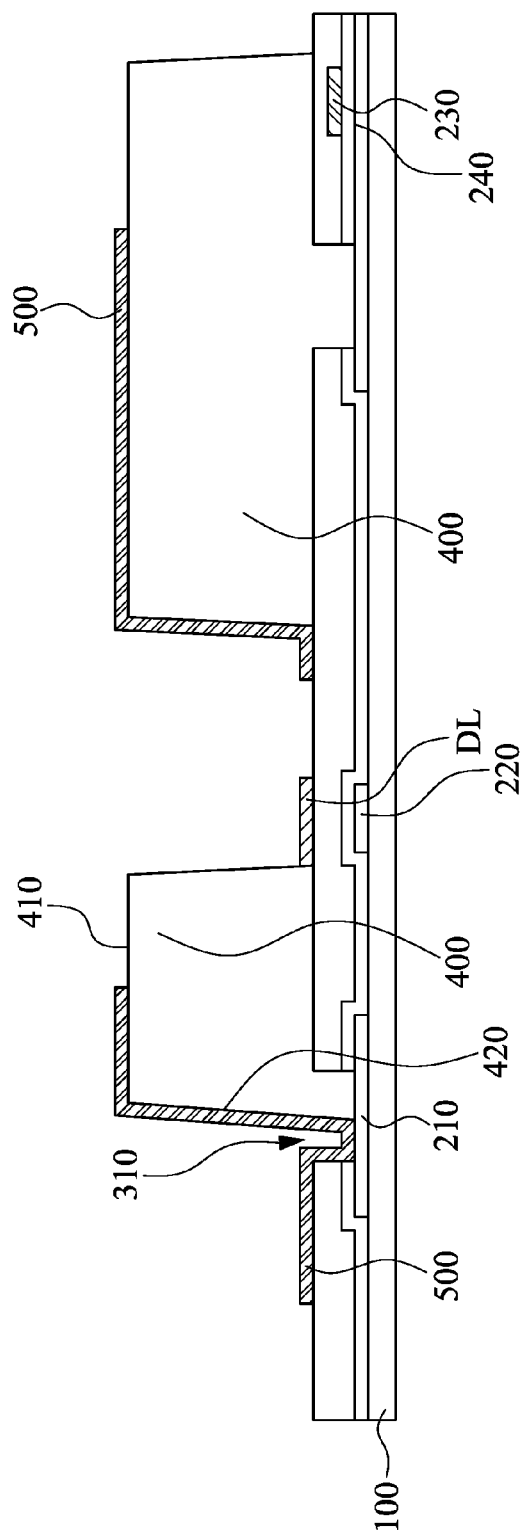

Referring to FIG. 7C, an insulation bump 400 is formed on the substrate 100. The insulation bump 400 covers at least partially the opening 310 and the inter-layer dielectric layer 300. In some embodiments, a material of the insulation bump 400 may be a photosensitive material, for example, an organic photosensitive material or a photoresist material, to form the insulation bump 400 by using an exposing and developing manufacturing procedure. However, the present disclosure is not limited thereto. Subsequently, a conductive layer 500 is formed on the substrate 100, and an appropriate photolithography manufacturing procedure and etching manufacturing procedure are performed on the conductive layer 500 to pattern the conductive layer 500. The conductive layer 500 is located on a top surface 410 and a side wall 420 of the insulation bump 400. The conductive layer 500 may be partially disposed in the opening 310, and is electrically connected to the drain electrode 210 of the switch device 200 through the opening 310. In some embodiments, a material of the conductive layer 500 may be indium tin oxide (ITO), indium zinc tin oxide (IZO), another appropriate transparent conductive material, or a non-transparent conductive material. However, the present disclosure is not limited thereto.

Figure 7D:
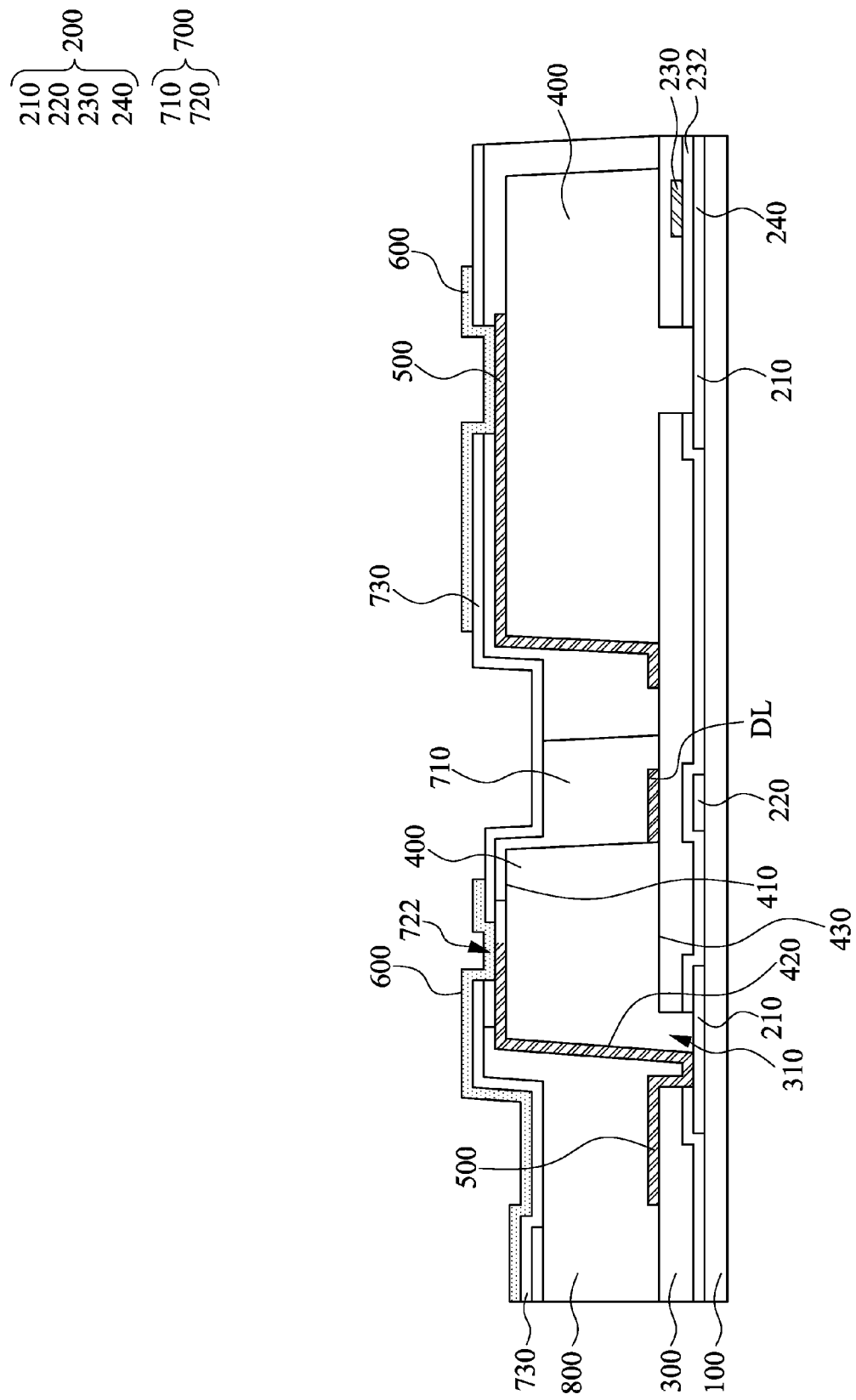

Referring to FIG. 7D, a pixel electrode 600 electrically connected to the conductive layer 500 is formed. The pixel electrode 600 is electrically connected to the conductive layer 500 located on the top surface 410 of the insulation bump 400. In addition, before the step of forming the pixel electrode 600, a passivation layer 800 may be first formed on the inter-layer dielectric layer 300. At least one part of the passivation layer 800 does not cover the conductive layer 500 located on the top surface 410 of the insulation bump 400, so that the pixel electrode 600 is electrically connected to the conductive layer 500. However, the present disclosure is not limited thereto. In some embodiments, the passivation layer 800 may be configured to protect the switch device 200 or may be configured to provide a display color. For example, in some embodiments, a material of the passivation layer 800 may be an organic dielectric layer (such as a photoresist layer). In other embodiments, the passivation layer 800 may be a color filter layer, a coverage layer, or a combination of the foregoing layers. However, the present disclosure is not limited thereto. In this way, the active device array substrate 10 shown in FIG. 7D may be completed by means of the foregoing steps. It should be noted that the conductive layer 500 located in the opening 310 may be used as an electrode of the drain electrode 210, that is, the electrode of the drain electrode 210 and the conductive layer 500 may be manufactured in a same photo-masking procedure, and no extra photo-masking procedure is needed. Therefore, the electrode of the drain electrode 210 and the conductive layer 500 that is connected to the pixel electrode 600 may be formed without increasing manufacturing complexity.

Figure 8B:
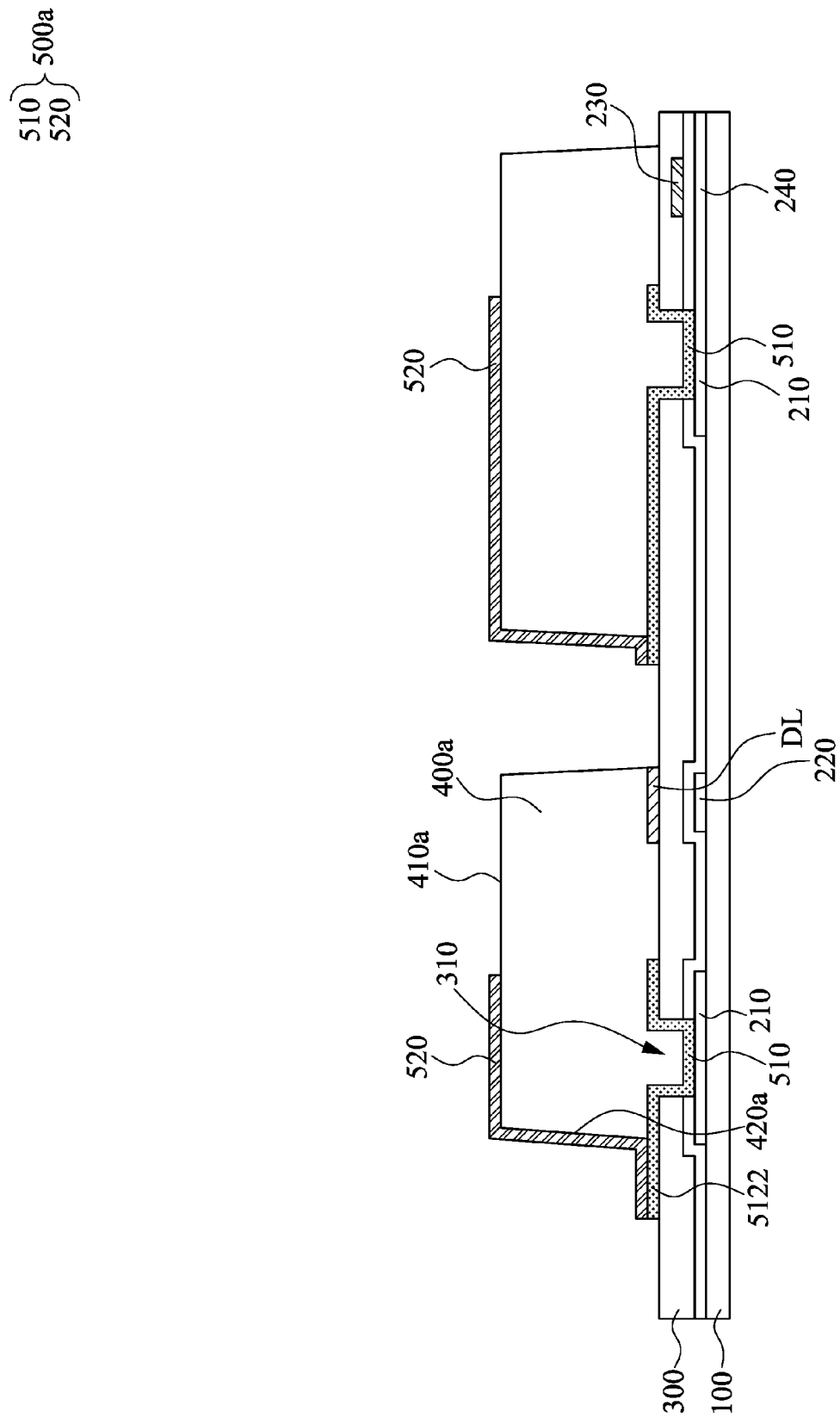

Referring to FIG. 8A and FIG. 8B, FIG. 8A and FIG. 8B show cross-sectional views of different stages of an active device array substrate 10a in a manufacturing procedure according to some embodiments of the present disclosure, where a cross-sectional location corresponds to a line segment 2B-2B' in FIG. 2A. The step of forming an inter-layer dielectric layer 300, an opening 310, and a pixel electrode 600 in this embodiment is the same as that in the foregoing embodiment, and details are not described herein again.

Referring to FIG. 8A, a first conductive sub-layer 510 is formed on the inter-layer dielectric layer 300, where the first conductive sub-layer 510 is electrically connected to a drain electrode 210 of a switch device 200 by using the opening 310. The first conductive sub-layer 510 is located on the opening 310 and the inter-layer dielectric layer 300. For example, in some embodiments, the first conductive sub-layer 510 may completely cover the opening 310, or partially cover the opening 310. However, the present disclosure is not limited thereto.

Referring to FIG. 8B, an insulation bump 400a is formed, where the insulation bump 400a partially covers the first conductive sub-layer 510, and a part, which is not covered by the insulation bump 400a, of the first conductive sub-layer 510 is an overlapping portion 5122. The insulation bump 400a completely covers the opening 310 and is disposed on the inter-layer dielectric layer 300. An appropriate photolithography manufacturing procedure and etching manufacturing procedure are performed on the insulation bump 400a to pattern the insulation bump 400a, so that at least one part of the insulation bump 400a does not cover the first conductive sub-layer 510, that is, does not cover the overlapping portion 5122. Subsequently, a second conductive sub-layer 520 is formed on a top surface 410a and a side wall 420a of the insulation bump 400a, and the second conductive sub-layer 520 is electrically connected to the overlapping portion 5122, so that the first conductive sub-layer 510 and the second conductive sub-layer 520 form a conductive layer 500a together. Other details of this embodiment are approximately the same as what stated above, and are not described herein again.

In the foregoing multiple embodiments, according to the active device array substrate and the display device using the same in the present disclosure, the insulation bump at least partially covers the drain electrode of the switch device, and is electrically connected to the switch device and the pixel electrode by using the conductive layer. In this way, proportions occupied the switch device and the insulation bump in a sub pixel region of the active device array substrate may be reduced, to downscale a size of the sub pixel region of the active device array substrate, thereby increasing resolution of the display device using the active device array substrate. Moreover, fine adjustment may be performed on an area proportion occupied by the insulation bump in the active device array substrate by adjusting a location of the insulation bump, to adjust a size of a pixel region. In addition, according to the display device using the active device array substrates in the present disclosure, the spacer may be partially disposed on the insulation bump, so that there is a gap between the spacer and the active device array substrate. Therefore, upon impact of an external force, the spacer does not easily generate a relative friction with the active device array substrate under the spacer, so as to prevent the spacer from generating an undesirable scrap due to the friction, thereby reducing a shimmering bright dot or light leakage of the display device.

The present disclosure is disclosed through the foregoing embodiments; however, these embodiments are not intended to limit the present invention. Various changes and modifications can be made by any person skilled in the art without departing from the spirit and scope of the present disclosure. The protection scope of the present disclosure is subject to the appended claims.

What is claimed is:

1. An active device array substrate, comprising:
   a substrate;
   at least one switch device, located on the substrate;
   an inter-layer dielectric layer, located on the switch device, wherein the inter-layer dielectric layer has at least one opening, and the opening does not cover at least one part of a drain electrode of the switch device;
   at least one insulation bump, covering at least partially the opening;
   a first data line, electrically connected to a source electrode of the switch device;
   a second data line, adjacent to the switch device, wherein a vertical projection of the insulation bump onto the substrate and a vertical projection of the second data line onto the substrate overlap at least partially;
   at least one coverage layer, adjacent to the insulation bump, wherein a top surface of the coverage layer is lower than the top surface of the insulation bump;
   at least one conductive layer, located on a top surface and a side wall of the insulation bump, and electrically connected to the drain electrode of the switch device through the opening; and
   at least one pixel electrode, electrically connected to the conductive layer.

2. The active device array substrate according to claim 1, wherein the conductive layer comprises:
   a first conductive sub-layer, located at least partially on the inter-layer dielectric layer, and electrically connected to the drain electrode of the switch device through the opening, wherein the insulation bump partially covers the first conductive sub-layer, but the first conductive sub-layer has an overlapping portion that is not covered by the insulation bump; and
   a second conductive sub-layer, located at least partially on the top surface and the side wall of the insulation bump, and electrically connected to the overlapping portion of the first conductive sub-layer.

3. The active device array substrate according to claim 1, wherein the insulation bump completely covers the opening.

4. The active device array substrate according to claim 1, wherein a vertical projection of the insulation bump onto the substrate and a vertical projection of an active layer of the switch device onto the substrate overlap at least partially.

5. The active device array substrate according to claim 1, further comprising:
   at least one data line, electrically connected to a source electrode of the switch device, wherein a vertical projection of the insulation bump onto the substrate and a vertical projection of the data line onto the substrate overlap at least partially.

6. The active device array substrate according to claim 1, further comprising:
   at least one color filter layer, located at least partially between the pixel electrode and the inter-layer dielectric layer.

7. The active device array substrate according to claim 6, wherein the color filter layer has a first part that is located on the inter-layer dielectric layer and a second part that is located on the insulation bump.

8. The active device array substrate according to claim 7, wherein a thickness of the first part is greater than a thickness of the second part.

9. A display device, comprising:
   an active device array substrate, comprising:
      a substrate;
      at least one switch device, located on the substrate;
      an inter-layer dielectric layer, located on the switch device, wherein the inter-layer dielectric layer has at least one opening, and the opening does not cover at least one part of a drain electrode of the switch device;
      at least one insulation bump, covering at least partially the opening;
      at least one conductive layer, located on a top surface and a side wall of the insulation bump, and electrically connected to the drain electrode of the switch device through the opening; and
      at least one pixel electrode, electrically connected to the conductive layer;
   an opposing substrate;
   a display medium layer, located between the active device array substrate and the opposing substrate; and
   at least one spacer, located between the active device array substrate and the opposing substrate, and located at least partially on the insulation bump, wherein the spacer has a suspension portion that is not supported by the insulation bump, so that there is a gap between the suspension portion and the active device array substrate.

10. The display device according to claim 9, wherein the conductive layer of the active device array substrate comprises:
    a first conductive sub-layer, located at least partially on the inter-layer dielectric layer, and electrically connected to the drain electrode of the switch device through the opening, wherein the insulation bump partially covers the first conductive sub-layer, but the first conductive sub-layer has an overlapping portion that is not covered by the insulation bump; and
    a second conductive sub-layer, located at least partially on the top surface and the side wall of the insulation bump, and electrically connected to the overlapping portion of the first conductive sub-layer.

11. The display device according to claim 9, wherein the insulation bump completely covers the opening.

12. The display device according to claim 9, wherein a vertical projection of the insulation bump onto the substrate and a vertical projection of an active layer of the switch device onto the substrate overlap at least partially.

13. The display device according to claim 9, wherein the active device array substrate further comprises:
    at least one data line, electrically connected to a source electrode of the switch device, wherein a vertical projection of the insulation bump onto the substrate and a vertical projection of the data line onto the substrate overlap at least partially.

14. The display device according to claim 9, wherein the active device array substrate further comprises:
    a first data line, electrically connected to a source electrode of the switch device; and
    a second data line, adjacent to the switch device, wherein a vertical projection of the insulation bump onto the substrate and a vertical projection of the second data line onto the substrate overlap at least partially.

15. The display device according to claim 9, wherein the active device array substrate further comprises:
    at least one color filter layer, located at least partially between the pixel electrode and the inter-layer dielectric layer.

16. The display device according to claim 15, wherein the color filter layer has a first part that is located on the inter-layer dielectric layer and a second part that is located on the insulation bump, and a thickness of the first part is greater than a thickness of the second part.

17. The display device according to claim 9, wherein the active device array substrate further comprises:
    at least one coverage layer, adjacent to the insulation bump, wherein a top surface of the coverage layer is lower than the top surface of the insulation bump.

18. A method for manufacturing a display device, comprising:
    manufacturing an active device array substrate, comprising:
       forming at least one switch device on a substrate;
       forming an inter-layer dielectric layer on the switch device;
       forming at least one opening in the inter-layer dielectric layer, wherein the opening does not cover at least one part of a drain electrode of the switch device;
       forming at least one insulation bump and at least one conductive layer, wherein the insulation bump covers at least partially the opening, the conductive layer is located on a top surface and a side wall of the insulation bump, and the conductive layer is electrically connected to the drain electrode of the switch device through the opening; and
       forming at least one pixel electrode electrically connected to the conductive layer;
    forming an opposing substrate; and
    forming at least one spacer between the active device array substrate and the opposing substrate, wherein the spacer is located at least partially on the insulation bump, and the spacer has a suspension portion that is not supported by the insulation bump, so that there is a gap between the suspension portion and the active device array substrate.

19. The method according to claim 18, wherein the step of forming the insulation bump and the conductive layer comprises:
    forming a first conductive sub-layer on the inter-layer dielectric layer, wherein the first conductive sub-layer is electrically connected to the drain electrode of the switch device through the opening;
    forming the insulation bump, wherein the insulation bump partially covers the first conductive sub-layer, and a part, which is not covered by the insulation bump, of the first conductive sub-layer is an overlapping portion; and
    forming a second conductive sub-layer on the top surface and the side wall of the insulation bump, wherein the second conductive sub-layer is electrically connected to the overlapping portion, so that the first conductive sub-layer and the second conductive sub-layer form the conductive layer together.

* * * * *